United States Patent [19]

Graham, III et al.

[11] Patent Number: 4,786,904
[45] Date of Patent: Nov. 22, 1988

[54] ELECTRONICALLY PROGRAMMABLE GATE ARRAY HAVING PROGRAMMABLE INTERCONNECT LINES

[75] Inventors: Hatch Graham, III, Santa Clara; Daniel Seltz, Mountain View, both of Calif.

[73] Assignee: Zoran Corporation, Santa Clara, Calif.

[21] Appl. No.: 941,765

[22] Filed: Dec. 15, 1986

[51] Int. Cl.⁴ .................... H04Q 9/00; H03K 17/693
[52] U.S. Cl. .................... 340/825.830; 307/465; 364/488; 364/716
[58] Field of Search .................... 340/825.83, 825.86, 340/825.87, 825.93; 307/445, 465, 448, 468, 464, 304; 357/51; 364/490, 491, 716, 488

[56] References Cited

U.S. PATENT DOCUMENTS

| | | | |
|---|---|---|---|
| 4,124,899 | 11/1978 | Birkner et al. | 307/465 |
| 4,531,066 | 7/1985 | Kearns | 307/465 |
| 4,590,589 | 5/1986 | Gerzberg | 357/51 |
| 4,596,938 | 6/1986 | Cartwright, Jr. | 307/468 |
| 4,612,459 | 9/1986 | Pollachek | 307/468 |
| 4,631,686 | 12/1986 | Ikawa et al. | 340/825.83 |
| 4,642,487 | 2/1987 | Carter | 307/465 |
| 4,670,749 | 6/1987 | Freeman | 340/825.86 |
| 4,689,654 | 8/1987 | Brockmann | 307/465 |

Primary Examiner—Donald J. Yusko
Attorney, Agent, or Firm—Flehr, Hohbach, Test, Albritton & Herbert

[57] ABSTRACT

An electronically programmable gate array comprises a plurality of rows of logic cells with each cell having a plurality of inputs, at least one output, and a plurality of electronically programmable voltage levels for configuring the cell. A plurality of sets of interconnect lines are formed in the array with one set of interconnect lines provided between adjacent rows of logic cells with electronically programmable contacts connecting inputs and an output of each cell in a row of cells with two adjacent sets of interconnect lines. Each row of logic cells preferably includes alternating three-input cells and two-input cells. Each electronically programmable voltage level comprises two voltage alterable resistors serially connected between first and second voltage potentials. Each electronically programmable interconnect comprises a voltage alterable resistor.

2 Claims, 5 Drawing Sheets

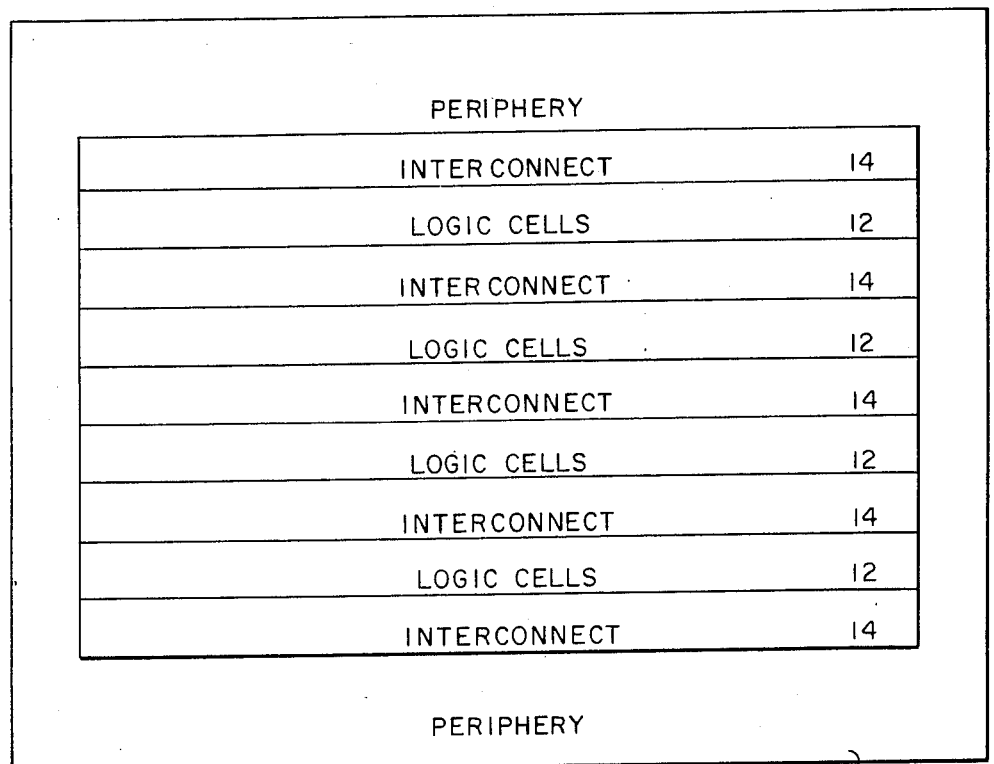
FIG.—1
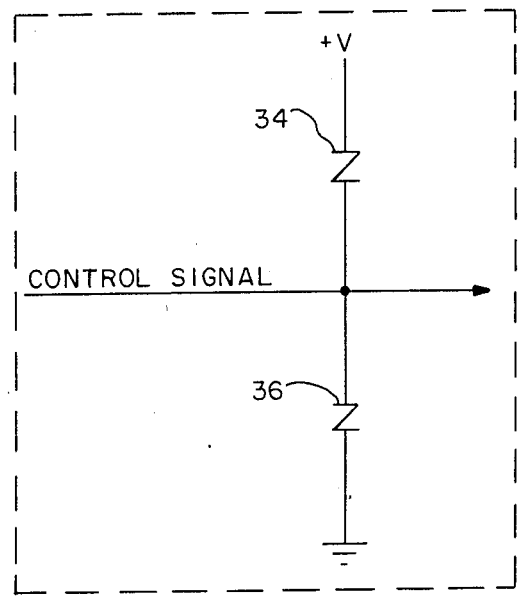
FIG.—6

4,786,904

ELECTRONICALLY PROGRAMMABLE GATE ARRAY HAVING PROGRAMMABLE INTERCONNECT LINES

BACKGROUND OF THE INVENTION

This invention relates generally to programmable logic circuitry, and more particularly the invention relates to circuitry which is flexible in application and efficient in circuit implementation.

Programmable logic circuits are important design tools and also provide a convenient replacement for small and medium scale integrated circuits. They allow the circuit designer to reduce package count with attendant lower cost and higher reliability. They also reduce inventory costs since a single programmable circuit can be used for many different applications.

A number of integrated circuits are known which offer programming flexibility. The electrically programmable logic array (PLA) and the field programmable logic array (FPLA) offer circuit flexibility but require complex circuitry which is not cost effective. The PLA comprises an array of logical AND gates and OR gates which can be programmed by mask during manufacture or by fusible links for a specific function in random logic networks, data routing, code converters, decoders, and the like.

The programmable array logic (PAL) was introduced to improve cost effectiveness but has substantially less flexibility in use. As described in U.S. Pat. No. 4,124,899, the PAL comprises a matrix of circuit inputs and the inputs to a plurality of AND gates. Outputs from subgroups of AND gates are non-programmably connected as inputs to individual, specific OR gates.

Copending application Ser. No. 754,653 filed July 15, 1985, now abandoned, discloses an electronically programmable gate array which has instant field programming features and includes universal (i.e. versatile configurable or programmable) logic cells. Moreover, the array is inexpensive and permits quick logic design and implementation. Since the array provides fast return time, circuits can be designed, fabricated, tested and installed more quickly than custom circuitry (e.g. gate array, standard cells, and full custom) and permit lower relative costs of producing a final product when non-recurring expenses are included.

Briefly, the electronically programmable gate array includes a plurality of cells with each cell including a plurality of gates which can provide at least one programmable logic function such as a gate, a flip-flop, and the like. A programmable interconnect structure is provided to selectively interconnect the gates of each cell and the plurality of cells. The selectively interconnected cells are interconnected by means of address and programming lines, with input/output pins, clock, and reset lines. Each of the cells is programmable to alter the specific functions thereof. Accordingly, a wide variety of programming options are provided. In accordance with one feature of the invention, electrically programmable elements determine the interconnect pattern and the specific function of the cells (e.g. gates and flip-flops).

SUMMARY OF THE INVENTION

The present invention is directed to an electonically programmable gate array and a unique array architecture whereby the interconnection of gates is facilitated. In accordance with a preferred embodiment, the gate array comprises a plurality of rows, each containing a plurality of logic cells, each cell having a plurality of inputs, at least one output, and a plurality of electronically programmable voltage levels for configuring the cell. A plurality of sets of interconnect lines are provided with one set of interconnect lines being provided between adjacent rows of logic cells and with electronically programmable means selectively connecting inputs and an output of each cell in a row of cells with two adjacent sets of interconnect lines.

In a preferred embodiment each row of logic cells includes alternating three input cells and two input cells. Each electronically programmable voltage level cells comprises two voltage alterable resistors serially connected between first and second voltage potentials with means connecting the common terminal of the resistors to the logic cell.

In accordance with another feature of the invention the programmable means interconnecting inputs and an output of each cell in a row of cells with the adjacent sets of interconnect lines comprises a voltage variable resistor having minimum capacitance associated therewith.

The invention and objects and features thereof will be more readily apparent from the following detailed description and appended claims when taken with the drawing.

BRIEF DESCRIPTION OF THE DRAWINGS

FIG. 1 is a functional block overview of an electronically programmable gate array in accordance with the invention.

FIG. 6 is a schematic of an electronically programmable voltage level as used in the cells of FIGS. 4 and 5.

DETAILED DESCRIPTION OF ILLUSTRATIVE EMBODIMENT

Figure 2:
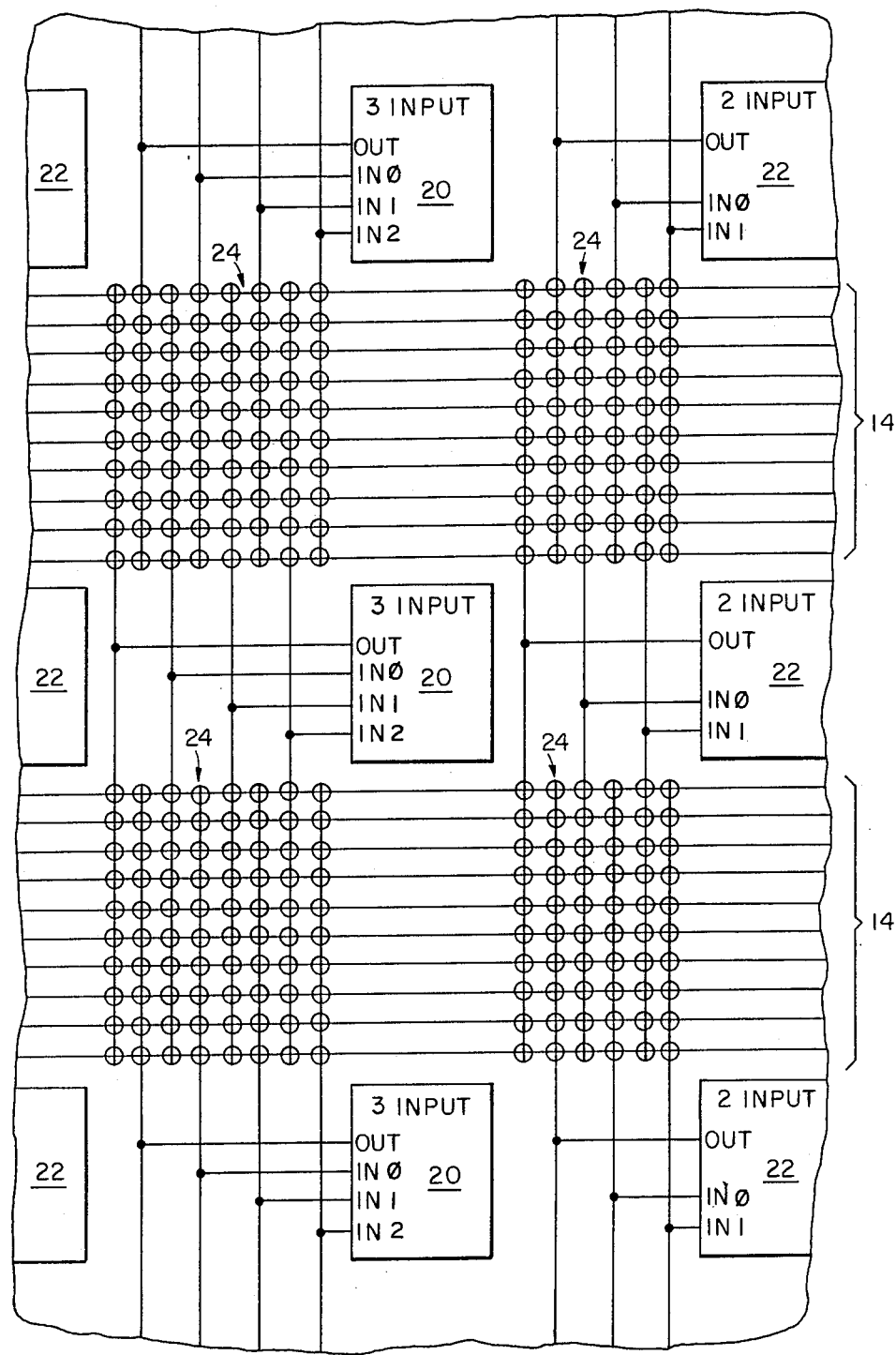
FIG. 2 is a functional block diagram of a portion of the array of FIG. 1 further illustrating rows of logic cells and rows of programmable interconnect lines therein.

Referring now to the drawings, FIG. 1 is a functional block overview of an electronically programmable gate array in accordance with the invention. The array is fabricated in a monolithic semiconductor chip 10 and comprises a plurality of logic cells 12 and a plurality of interconnect lines 14. Each row of logic cells has a set of interconnect lines 14 on either side thereof. The periphery of the semiconductor chip 10 surrounding the gate array structure accommodates test and programming circuitry for the array, and means for handling input and output signals.

FIG. 2 is a functional block diagram of a portion of the array of FIG. 1 and further illustrates the logic cells in each row and the interconnect channels between rows. In a preferred embodiment each row of logic cells includes alternating three-input cells 20 and two-input cells 22. The inputs and output for each cell are interconnected with lines in each adjacent interconnect channel by means of programmable interconnects illustrated by the circles 24. In this embodiment each interconnect channel comprises ten lines, and each input and each output of the cells is interconnectable with any one of the lines by means of the programmable elements 24. While various programming elements are known in the art, the preferred programming element is the voltage variable resistor disclosed in Gerzberg U.S. Pat. No. 4,590,589. The voltage programmable structure disclosed therein comprises a resistor structure including a body of semiconductor material having high electrical conductance and a surface contact region having a crystalline structure characterized by relatively high electrical resistance. The relatively high electrical resistance can be established by amorphotizing the surface region or by forming lattice defects in the crystalline structure such as by ion implantation. In programming the resistor device a sufficient voltage is applied across the resistor whereby the surface region becomes heated sufficiently to reduce the relatively high electrical resistance. Such a programming device has the advantages of being readily manufactured using conventional semiconductor processing techniques and low capacitance associated therewith.

Figure 3:
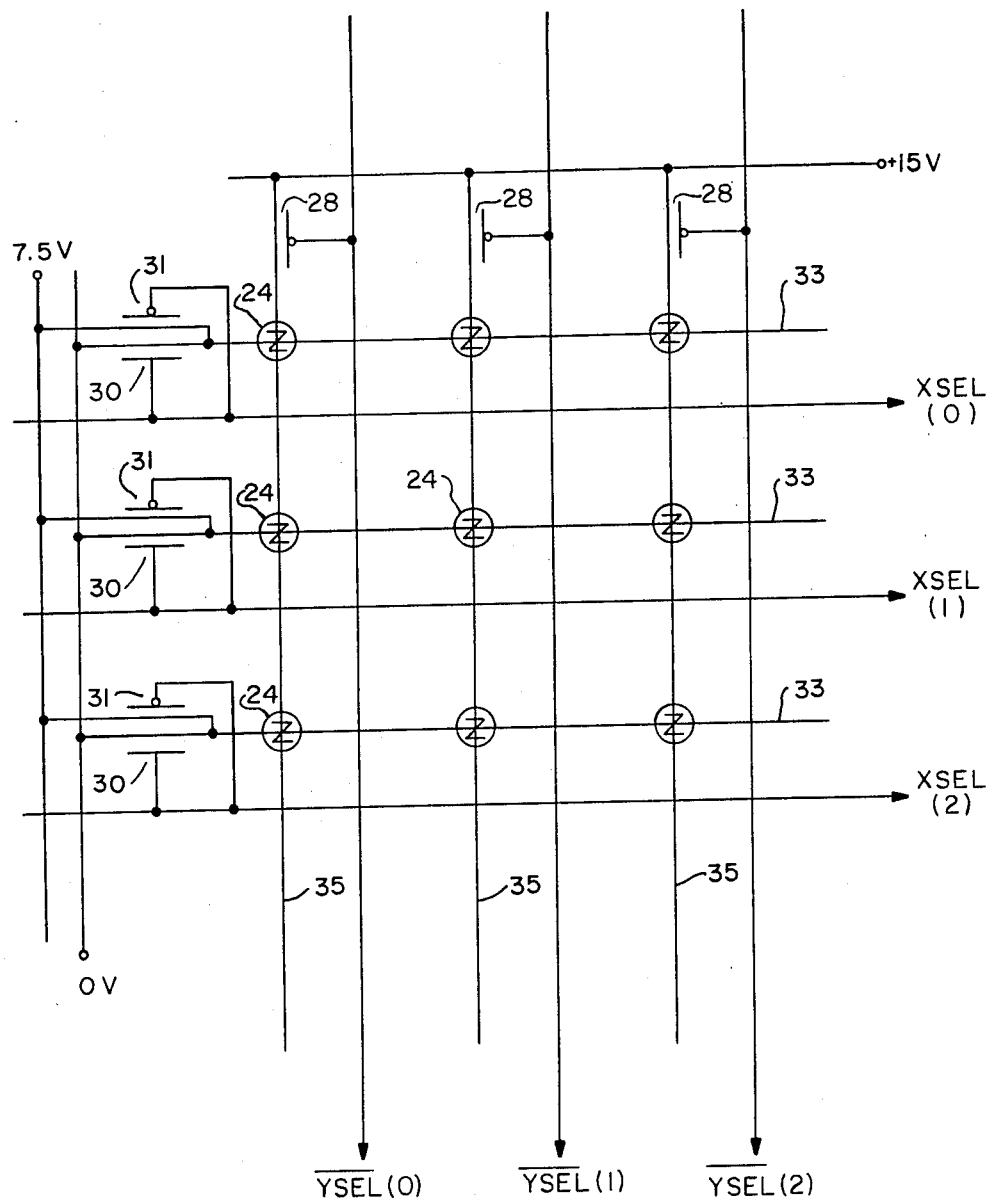
FIG. 3 is a schematic of voltage alterable resistors in the interconnect lines of FIGS. 1 and 2.
Figures 4A, 4B:
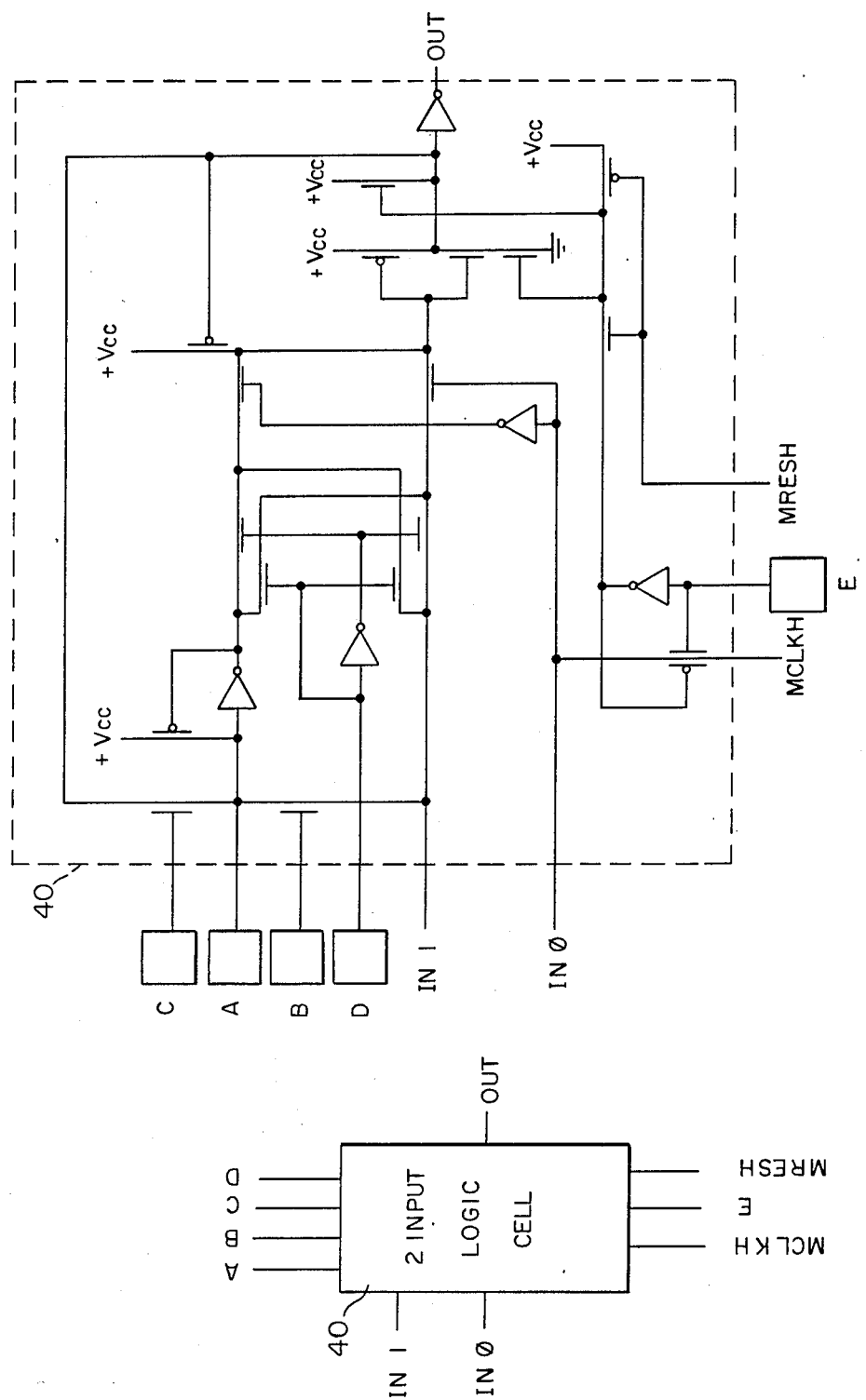
FIGS. 4A and 4B are a block diagram and a circuit schematic of a two-unit cell for use in the array of FIG. 1.
Figures 5A, 5B:
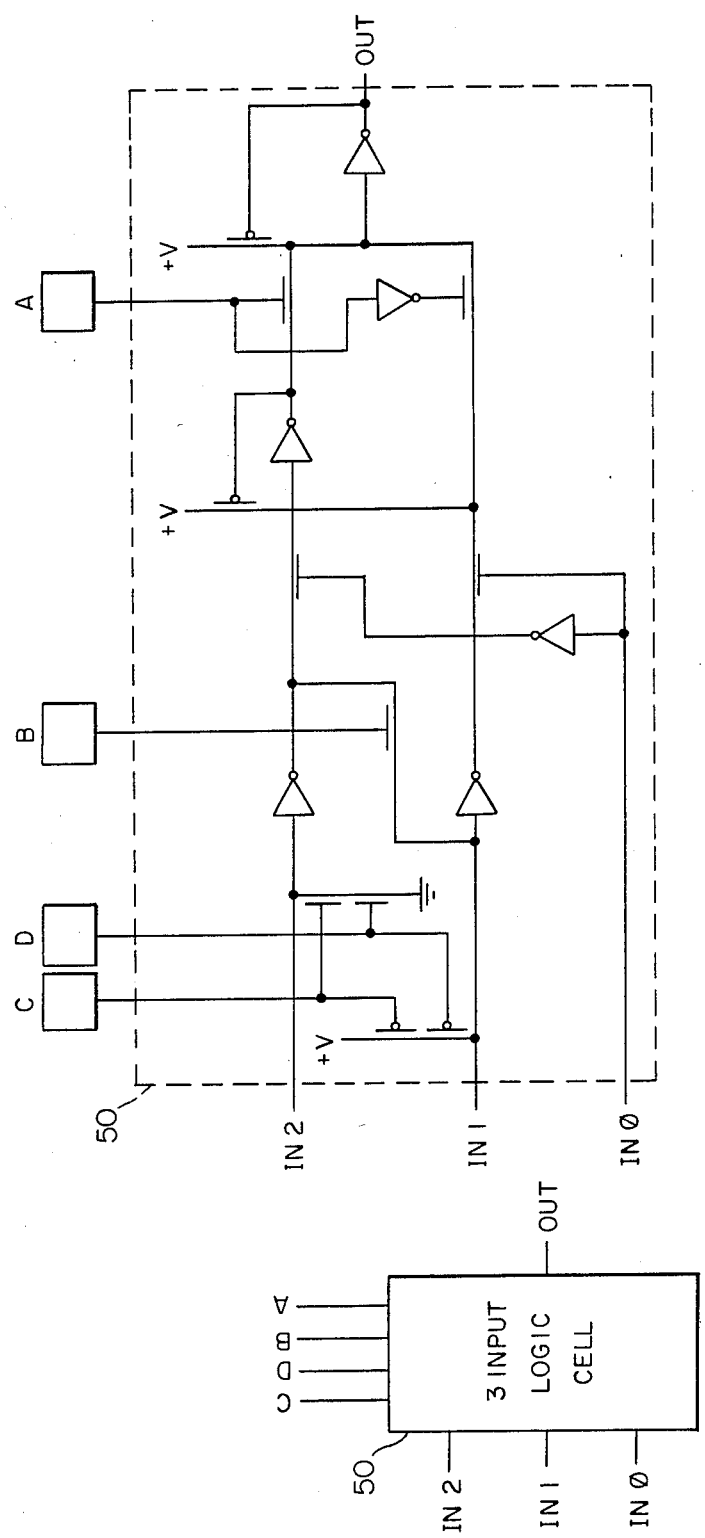
FIGS. 5A and 5B are a block diagram and a circuit schematic of a three-input cell for use in the array of FIG. 1.

FIG. 3 is a schematic representation of circuitry for programming the voltage variable resistors of FIG. 2. Each vertical Y-select line has associated therewith a programming transistor 28, and each horizontal X-select line has associated therewith a transistor 30. By selectively biasing a transistor 28 and a transistor 30, a programming voltage (e.g., +15 V) and a ground potential are applied across a variable resistor 24 which is sufficient to convert the resistance state of the resistor to a lower conductive level. During programming of the selected variable resistor the unselected horizontal interconnect lines 33 are connected to a supply equal to half the programming voltage (e.g., 7.5 V selected by transistors 31). The unselected vertical interconnect lines 35 are floating. The variable resistor's programming threshold is greater than 7.5 V but less than 15 V Only one horizontal interconnect line can be programmably connected to each vertical interconnect line.

In order that each input and output of each cell can be connected to a horizontal interconnect line in both of the two interconnect channels adjacent to (e.g. above and below) the row of cells, additional means can be provided for isolating the two portions of the vertical interconnect line associated with the respective adjacent horizontal interconnect channels. However, interconnection to both interconnect channels is not essential to operation. The vertical interconnect lines are the inputs and outputs of the cells.

FIGS. 4A and 4B and FIGS. 5A and 5B are a block diagram and circuit schematic of a two-input and a three-input logic cell useful in the array of FIG. 1. The logic functions realized with the two-input logic cell 40 of FIG. 4 is given in accordance with the following table:

| LOGIC FUNCTION | INPUTS | | | | | | | | |
|---|---|---|---|---|---|---|---|---|---|
| | A[1] | B[1] | C[1] | D[1] | E[1] | MCLKH[3] | MRESH[3] | IN[1] | IN[2] |
| 2-IN OR | H | L | L | H | L | MCLK | MRES | INP | INP |
| 2-IN AND | L | L | L | L | L | MCLK | MRES | INP | INP |
| 2-IN IAND | L | L | L | H | L | MCLK | MRES | INP | INP |
| 2-IN IOR | H | L | L | L | L | MCLK | MRES | INP | INP |
| 2-IN EXOR | L | H | L | H | L | MCLK | MRES | INP | INP |
| 2-IN EXNOR | L | H | L | L | L | MCLK | MRES | INP | INP |
| INVERTER | H | H | L | L | L | MCLK | MRES | TRI | INP |
| D-TYPE LATCH | L | L | H | H/L[4] | H | MCLK | MRES | DATA | CLK |
| D-TYPE LATCH W/MCLK,MRES | L | L | H | H/L[4] | H | MCLK | MRES | DATA | TRI |

[1]Input must be permanently fixed by means of "EPVL" modules.
[2]Input may be tri-stated or driven depending on desired logic cell function.
[3]Input must be driven.
[4]A high (H) or low (L) respectively configure the latch as a slave or master.

The logic functions realizable with the three-input logic cell are given in accordance with the following table:

| LOGIC FUNCTION | INPUTS | | | | | | |
|---|---|---|---|---|---|---|---|
| | A[1] | B[1] | C[1] | D[1] | IN2[2] | IN1[2] | IN0 |
| 2-IN OR | L | L | L | L | INP | TRI | INP |
| 2-IN NOR | H | L | L | L | INP | TRI | INP |
| 2-IN AND | L | L | H | H | TRI | INP | INP |
| 2-IN NAND | H | L | H | H | TRI | INP | INP |
| 2-IN EXOR | L | H | L | H | INP | TRI | INP |
| 2-IN EXNOR | H | H | L | H | INP | TRI | INP |
| 3-IN MUX | L | L | L | H | INP | INP | INP |
| INVERTER | H | H | H | H | TRI | TRI | INP |

[1]Input must be permanently fixed by means of "EPVL" modules.
[2]Input may be tri-stated or driven depending on desired logic cell function.

The programming of the two-input logic cell 40 and a three-input logic cell 50 illustrated in FIGS. 4 and 5 is effected through use of electronically programmable voltage levels (EPVL) between a low voltage state (L) and a high voltage state (H). A schematic of the EPVL is given in FIG. 6. Two voltage programmable resistors 34 and 36 are serially connected between a high voltage potential, +V, and a low voltage potential, ground. By applying a suitable voltage on the control signal line and selectively rendering one of the voltage programmable resistors conductive, such as described above with reference to FIG. 3, either the high voltage level or the ground potential can be applied to a circuit terminal. Thus, the programming of the voltage variable resistors 34, 36 is effected through the voltage on the control signal line and the ground or +V potentials.

The design of an electronically programmable gate array in accordance with the invention with interconnect channels provided between rows of programmable logic cells facilitates the fabrication and programming of large and complex gate arrays. The programming of a cell by electronically programmable voltage levels and the interconnection of cells using the voltage variable resistors facilitates programming and minimizes the capacitance associated with the programming elements. While the invention has been described with reference to a specific embodiment, the description is illustrative of the invention and is not to be construed as limiting.

Various modifications and applications may occur to those skilled in the art without departing from the true spirit and scope of the invention as defined by the appended claims.

We claim:

1. An electronically programmable gate array comprising a plurality of rows of logic cells, each row of logic cells includes alternating three-input cells of programmable gates and two-input cells of programmable gates, each cell having a plurality of inputs, at least one output, and a plurality of electronically programmable voltage levels for configuring the cell, wherein each electronically programmable voltage level comprises two voltage alterable resistors serially connected between first and second voltage potentials, and a plurality of sets of interconnect lines, one set of interconnect lines provided between adjacent rows of logic cells with electronically programmable means connecting inputs and an output of each cell in a row of cells with either of two adjacent sets of interconnect lines, each electronically programmable means comprises a voltage alterable resistor.

2. The electronically programmable gate array as defined by claim 1 wherein each two-input logic cell is programmable for the following functions:
2-IN OR
2-IN AND
2-IN IAND
2-IN IOR
2-IN EXOR
2-IN EXNOR
INVERTER
D-TYPE LATCH and each three-input logic cell is programmable for the following functions:
2-IN OR
2-IN NOR
2-IN AND
2-IN NAND
2-IN EXOR
2-IN EXNOR
3-IN MUX
INVERTER.

* * * * *